United States Patent
Lightbody et al.

(10) Patent No.: US 7,417,558 B2
(45) Date of Patent: Aug. 26, 2008

(54) WIRELESS COMMUNICATIONS SYSTEM INCORPORATING INTELLIGENT ELECTRONIC DEVICES

(75) Inventors: Simon H. Lightbody, Victoria (CA); Peter C. Cowan, Victoria (CA); Hal E. Etheridge, Brentwood Bay (CA); J. Bradford Forth, Victoria (CA); Colin N. Gunn, Victoria (CA); Martin A. Hancock, Victoria (CA)

(73) Assignee: Power Measurement Ltd., Saanichton, British Columbia (CA)

(*) Notice: Subject to any disclaimer, the term of this patent is extended or adjusted under 35 U.S.C. 154(b) by 498 days.

(21) Appl. No.: 10/843,256

(22) Filed: May 11, 2004

(65) Prior Publication Data

US 2004/0229578 A1 Nov. 18, 2004

Related U.S. Application Data

(60) Provisional application No. 60/469,766, filed on May 12, 2003.

(51) Int. Cl.
*G01R 31/08* (2006.01)
*H04Q 7/00* (2006.01)
*H04M 1/00* (2006.01)
*H04B 1/38* (2006.01)
*G08C 19/16* (2006.01)
*G08C 19/04* (2006.01)

(52) U.S. Cl. ............... 340/870.21; 340/870.39; 455/575.1; 455/90.03; 370/241; 370/252; 370/329

(58) Field of Classification Search ............... 455/405, 455/90.1, 90.3, 575.5, 575.1; 340/870.2, 340/870.9, 870.01, 870.05, 870.18, 870.21, 340/870.39, 870.02; 370/241, 252, 329, 370/310
See application file for complete search history.

(56) References Cited

U.S. PATENT DOCUMENTS

| | | | |
|---|---|---|---|
| 4,589,075 A | 5/1986 | Buennagel | 364/492 |
| 5,563,506 A | 10/1996 | Fielden et al. | |
| 5,644,514 A | 7/1997 | Abo et al. | |
| 5,684,466 A | 11/1997 | Keating et al. | |
| 5,736,847 A | 4/1998 | Van Doorn et al. | 324/142 |
| 5,808,558 A * | 9/1998 | Meek et al. | 340/870.01 |
| 5,949,230 A | 9/1999 | Kobayashi et al. | 324/72.5 |
| 6,018,700 A | 1/2000 | Edel | 702/60 |
| 6,154,710 A | 11/2000 | Kobayashi et al. | 702/65 |
| 6,181,294 B1 * | 1/2001 | Porter et al. | 343/859 |
| 6,233,327 B1 | 5/2001 | Petite | 379/155 |
| 6,278,357 B1 | 8/2001 | Croushore et al. | |
| 6,373,238 B2 | 4/2002 | Lewis et al. | 324/107 |
| 6,437,692 B1 | 8/2002 | Petite et al. | 340/540 |
| 6,462,713 B2 | 10/2002 | Porter et al. | 343/719 |
| 6,470,283 B1 | 10/2002 | Edel | 702/64 |
| 6,618,578 B1 | 9/2003 | Petite | 455/92 |
| 6,628,764 B1 | 9/2003 | Petite | 379/106.01 |
| 6,650,249 B2 | 11/2003 | Meyer et al. | 340/870.28 |
| 6,657,552 B2 * | 12/2003 | Belski et al. | 340/870.02 |
| 6,671,586 B2 | 12/2003 | Davis et al. | 700/295 |
| 6,985,087 B2 * | 1/2006 | Soliman | 340/870.02 |
| 6,996,154 B2 * | 2/2006 | Haas | 375/132 |
| 2001/0015640 A1 | 8/2001 | Hemminger et al. | 324/142 |
| 2001/0038343 A1 * | 11/2001 | Mayer et al. | 340/870.02 |
| 2002/0019712 A1 | 2/2002 | Petite et al. | 702/61 |
| 2002/0019725 A1 | 2/2002 | Petite | 702/188 |
| 2002/0063635 A1 * | 5/2002 | Shincovich | 340/870.02 |
| 2002/0071296 A1 | 6/2002 | Hemminger et al. | 363/34 |
| 2002/0109608 A1 | 8/2002 | Petite et al. | 340/870.02 |
| 2002/0150110 A1 | 10/2002 | Inbar et al. | 370/401 |
| 2002/0169643 A1 | 11/2002 | Petite et al. | 705/5 |
| 2003/0063723 A1 | 4/2003 | Booth et al. | 379/106.03 |

| | | | |
|---|---|---|---|
| 2003/0067725 A1 | 4/2003 | Horvath et al. | |
| 2003/0078029 A1 | 4/2003 | Petite | 455/404 |
| 2003/0098679 A1 | 5/2003 | Odaohhara | |
| 2003/0174067 A1 | 9/2003 | Soliman | 340/870.02 |
| 2003/0179135 A1 | 9/2003 | Louhi | 342/359 |
| 2004/0001008 A1 | 1/2004 | Shuey et al. | 340/870.02 |
| 2004/0001532 A1 | 1/2004 | Mason, Jr. et al. | 375/136 |
| 2004/0227621 A1* | 11/2004 | Cope et al. | 340/310.01 |

FOREIGN PATENT DOCUMENTS

| | | |
|---|---|---|
| EP | 395 495 A | 10/1990 |
| EP | 957 607 A1 | 11/1999 |
| WO | WO 01/59965 A1 | 8/2001 |

OTHER PUBLICATIONS

PCT International Search Report for Application No. PCT/US04/23006, Mar. 31, 2005.
PCT International Search Report PCT/CA2004/000705, Sep. 6, 2004.
Tele-Service News, dated Aug. 2002, Section: No. 8, vol. 14—"Ultra-Wideband Growth Predicted to Explode", 1 page.
Dr. Fontana, Multispectral Solutions, Inc.—History of UWB Technology—"A Brief History of UWB Communications" pp. 1-10, printed Jul. 1, 2004.
Patrick Mannion, CommsDesign EE Times "Ultrawideband facts and fictions", dated Feb. 1, 2002, pp. 1-4, printed Jul. 1, 2004.
Ian Cameron, Electronics Times, "Ultrawideband radio attacks spectrum drought", dated Sep. 26, 2002, 5 pages.
Dave Farber, Interesting-People Message"IP: Ultrawideband Squeezes In", dated Aug. 16, 2002, pp. 1-4, printed Jul. 1, 2004.
David G. Leeper, Scientific American.com, Wireless Data Blaster, dated May 4, 2002, pp. 1-4, obtained from http://www.sciam.com/print_version.cfm?articleID=0002D51D-0A78-1CD4-B4A8809EC5, printed Jul. 1, 2004.
Elster, "A3 Alpha® Meter With Network Collector Capabilities", Specifications, © 2003 by Elster Electricity, LLC, Raleigh, NC, Aug. 2003, 2 pages.
Elster, EnergyAxis® System Architecture, 1 page.
Elster, "EnergyAxis® System Technology to Empower Utilities," brochure, Elster Electricity, LLC, Raleigh, NC, 6 pages.
Elster "REX™ Meter", Specifications, © 2003 by Elster Electricity, LLC, Raleigh, NC, Aug. 2003, 2 pages.
Elster "Elster Electricity Announces New EnergyAxis® System with Intelligent Two-Way Communications" Corporate profile, © 2003 by Elster Electricity, LLC, Raleigh, NC, Aug. 2003, 1 page.
Elster Press Release Sep. 8, 2003, "Elster Electricity Introduces EnergyAxis® System for Residential and Small C&I Metering Automation", Elster Electricity, LLC, Raleigh, NC, 2 pages.
Kreiss Johnson brochure, "Open advancing substation automation", © 2003 Kreiss Johnson Technologies, Inc., San Diego, CA, 13 pages.

* cited by examiner

*Primary Examiner*—Hanh Nguyen
(74) *Attorney, Agent, or Firm*—Brinks Hofer Gilson & Lione (57) ABSTRACT

An intelligent electronic device (IED) for monitoring at least one power parameter in a power system is disclosed. The IED comprises at least one voltage input operative to be coupled with at least one power line in the power system and operative to sense at least one voltage in the power system. The IED further comprises at least one current input operative to be coupled with the at least one power line and operative to sense a current flowing through the at least one power line. The IED further comprises at least one analog to digital converter coupled to the voltage input and the current input and operative to produce digital samples indicative of the voltage and current. The IED further comprises a processor coupled with the at least one analog to digital converter and operative to calculate the at least one power parameter. The IED further comprises a power supply operative to supply power to the IED. The IED further comprises a transceiver operative to communicate at least one data packet comprising the at least one power parameter via time domain pulses of RF energy occupying a wide range of frequencies and an antenna coupled with the transceiver operative to transmit the RF data packet.

34 Claims, 4 Drawing Sheets

WIRELESS COMMUNICATIONS SYSTEM INCORPORATING INTELLIGENT ELECTRONIC DEVICES

RELATED APPLICATIONS

The present patent document claims the benefit of the filing date under 35 U.S.C. §119(e) of Provisional U.S. Patent Application Ser. No. 60/469,766, filed May 12, 2003 which is hereby incorporated by reference.

The following co-pending and commonly assigned PCT international application designating the U.S. has been filed on the same date as the present application. This application relates to and further describes other aspects of the embodiments disclosed in the present application and is herein incorporated by reference:

PCT International Application Ser. No. PCT/CA04/00705, "TIME COORDINATED ENERGY MONITORING SYSTEM UTILIZING COMMUNICATIONS LINKS", (Ref. No. 300104).

FIELD OF THE INVENTION

The present invention relates to a wireless communications architecture for systems of intelligent electronic devices. More specifically, the present invention relates to a wireless communications architecture providing at least one of high speed communications, low power consumption, multi-path interference resistance, electronic enclosure penetration capability, position determination, or combinations thereof.

BACKGROUND

Intelligent Electronic Devices (IEDs) are coupled with electric power lines for the purpose of monitoring at least one power parameter of the electric power lines. IEDs may be coupled with the power lines through an intermediate device, such as a sensor device, via a digital communications link between the intermediate device and the IED. Power parameters include, but are not limited to, rms voltage, rms current, kilowatts (kW), kilo volts-amps reactive (kVAR), kilo volts-amps (kVA), kW hours (kWh), kVA hours (kVAh), kVAR hours (kVARh), harmonics, power factor, symmetrical components, etc. IEDs may also be capable of communicating these power parameters to a user or to a remote computer via a display and/or a communications interface. Some examples of IEDs include digital power meters, microprocessor based energy meters, numerical protective relays, digital current sensors, digital voltage sensors, power quality measurement devices, etc.

Exemplary communications interfaces provided by an IED may include an RS-485, Ethernet, fiber optic, or IRDA, etc. compliant interface. Typically, multiple IEDs are coupled with a network to which a computer is also coupled. The computer may then retrieve power parameters from the IEDs, may instruct the IEDs to perform various control actions and/or may configure the IEDs via the network.

In place of wired interconnections, the use of various wireless radio frequency (RF) technologies for networking IEDs together has been proposed. These technologies include Bluetooth®, IEEE 802.11a, b and g, GSM, CDPD, CDMA, TDMA, radio modems, and other similar wireless communications technologies. Due to the harshness, i.e. RF-inhospitable characteristics, of the industrial environment where IEDs are typically installed, acceptance of wireless technology has not been widespread.

The reasons that wireless technologies have not become widespread for use with IEDs vary. Industrial facilities typically contain a large number of metallic enclosures and other machinery that is composed of metal. This abundance of metal causes various problems with RF transmission including multi-path interference and a shielding effect depending on the relative location of transmitting and receiving antennas used in the system. Various wireless technologies have been developed to address these environmental and reliability issues. Some technologies offer high speed communications, but use a relatively large amount of power. Some technologies use a small amount of power, but offer relatively slow speed communications. Some technologies offer enclosure penetration capability, but are relatively slow speed or relatively high power. Some technologies require expensive circuitry to overcome the problems of multi-path interference. Some technologies (for example the wireless phone standards GSM, CDMA, TDMA and CDPD or satellite based communications technologies) require, and are dependent upon, an expensive infrastructure of support and therefore are not autonomous, i.e., if the wireless phone network suffers a communications outage, so will the network of IEDs.

DETAILED DESCRIPTION OF THE PRESENTLY PREFERRED EMBODIMENTS

Herein, the phrase "coupled with" is defined to mean directly connected to or indirectly connected through one or more intermediate components. Such intermediate components may include both hardware and software based components. Further, to clarify the use in the pending claims and to hereby provide notice to the public, the phrases "at least one of <A>, <B>, ... and <N>" or "at least one of <A>, <B>, . . . <N>, or combinations thereof" are defined by the Applicant in the broadest sense, superceding any other implied definitions herebefore or hereinafter unless expressly asserted by the Applicant to the contrary, to mean one or more elements selected from the group comprising A, B, ... and N, that is to say, any combination of one or more of the elements A, B, . . . or N including any one element alone or in combination with one or more of the other elements which may also include, in combination, additional elements not listed.

The disclosed embodiments will be described herein with reference to a digital power meter 100 as an exemplary IED. It will be appreciated that other types of IEDs may also be used.

As will be described in more detail below, a digital power meter 100, according to one embodiment, is adapted to detect voltage and current signals from a power system, such as a 3 phase power system operating at 50 or 60 Hz. The digital power meter calculates various power parameters and transmits them over an ultrawideband communications link. The digital power meter 100 also receives configuration and control information over the ultrawideband communications link.

The digital power meter 100 may be mounted in a switchgear cabinet or other electrical enclosure. Typically the enclosure will have various cutouts and slots and therefore will not provide an ideal Faraday cage, but will be effective at blocking, or at least significantly interfering with communications signals in a portion of the RF spectrum (which may include that portion used by a desirable communications technology). For communications over the ultrawideband communications link, the digital power meter 100 contains an ultrawideband antenna that allows communications within and outside of the enclosure.

Figure 6:
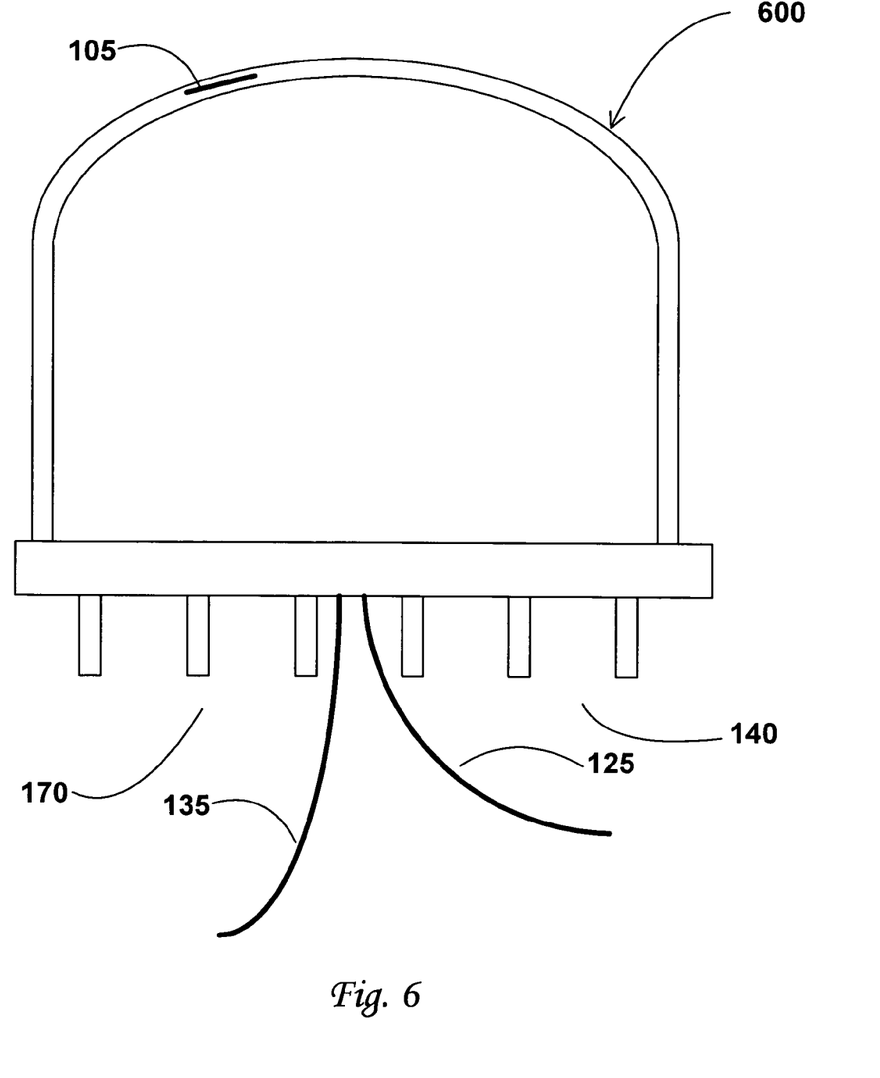
FIG. 6 illustrates a digital power meter housing according to one embodiment.

It will be appreciated that the ultrawideband antenna may be located within, embedded within or protrude through the digital power meter 100 housing 600, as will be described below with respect to FIG. 6. In one embodiment the digital power meter 100 housing 600 is manufactured using plastic or otherwise RF-transparent material which allows the antenna 105 located within the housing 600 to communicate wirelessly through the housing 600. In an alternate embodiment the antenna 105 is embedded into the housing 600, for example embedded into a plastic chassis or cover, or on a feature of the housing such as a button, label, or plug, so as to be RF-visible to external devices. For example, the antenna 105 may be laminated between the material layers of the housing 600 or chassis or may be molded or implanted directly into the device's structural or non-structural features or housing 600. Alternatively, the antenna 105 or antenna elements may be used as an "insulating antenna" to communicate through the device cover or housing 600, thus using the cover as dielectric support. For example, if a device has a cover or chassis which encloses the device circuitry, the transmitter and receiver being located within the enclosure, the internal circuitry makes internal contact with a specific portion or point of the cover. On the same point on the cover, but on the external side of the cover an antenna 105 is coupled with the cover. It will be appreciated that the antenna 105 can be utilized for forms of transmission other than ultrawideband communications.

Ultrawideband communication is characterized by transmission of substantially short (eg., in the range of 0.5 ns) pulses at a very low power level (eg., less than a milliwatt) across a wide frequency range, across all, or a significant portion, of the frequencies at once. Ultrawideband communication transmission of longer pulses at higher power is also possible assuming regulatory approval. Using pulse position modulation (PPM) or other modulation schemes, the digital ones and zeros of digital communication are added to the signal. This results is a carrier-less communication that has a very wide bandwidth (for instance an output filter on a transmitter may limit the bandwidth to a range of 500 MHz,–2 GHz, etc. within a given band such as a band located at a frequency above 3 GHz). Due to the width of spectrum, multi-path reflections may be resolved rather than combining destructively as in other RF communications methods. Since the power is low and the bandwidth wide, the ultrawideband transmission may have little affect on other RF transmitting/ receiving devices since the signal is swamped by the background noise level. While the use of more power will increase the range of transmission, the potential for interference with other RF spectrum utilizing devices is increased. The power output and allowable spectrum usage is governed by national agencies such as the Federal Communications Commission (FCC) in the U.S.A. and the European Telecommunications Standards Institute (ETSI) in Europe. The disclosed embodiments are capable of communicating within the allowable applicable regulatory standards. In an alternate embodiment, the disclosed communications architecture may support multiple different regulatory standards and facilitate switching between standards depending upon the jurisdiction in which the devices are located.

Figure 1:
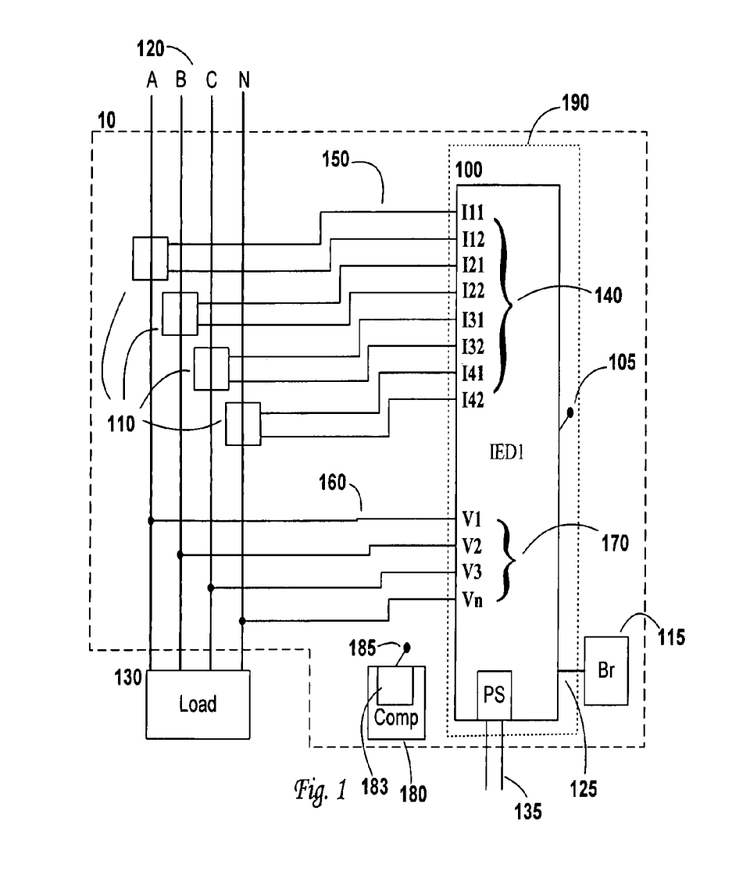
FIG. 1 illustrates a power monitoring system incorporating a digital power meter according to one embodiment.

FIG. 1 shows an exemplary power monitoring system 10 incorporating a digital power meter 100 according to one embodiment. In the exemplary system 10, the digital power meter 100 is mounted in an electrical panel 190. It will be appreciated that the system 10 may include additional IEDs which are not shown. In the exemplary system 10, the electrical panel 190 is metallic and forms a partial RF shield around the digital power meter 100. A three phase WYE power system including power conductors 120 feeds a three phase load 130. Although a three phase WYE system has been diagrammed, other power systems including three phase DELTA and single phase may also be used. The digital power meter 100 includes analog current inputs 140 that couple through the current leads 150 to the current sensors 110 which sense current in the power conductors 120. The current sensors 110 may be any appropriate type of analog sensor including current transformers, Hall effect devices, Rogowski coils, etc. The digital power meter 100 also includes analog voltage inputs 170 which couple through the voltage leads 160 to the power conductors 120. The analog voltage inputs 170 may be coupled with the power conductors 120 through appropriate transformers where the voltage level of the power conductors is beyond the input range of the voltage inputs 170. Power supply leads 135 feed power to the digital power meter 100. I/O lines 125 control and monitor a breaker 115 or other external devices. The digital power meter 100 further includes an ultrawideband communications system (not shown) including an ultrawideband antenna 105 for transmission and reception of digital data.

The exemplary power monitoring system 10 further includes a computer 180 which also includes an ultrawideband communications system (not shown) including an ultrawideband antenna 185. The ultrawideband communications system of the computer 180 may include an ultrawideband transceiver in the form of an ultrawideband communications card 183. Alternatively, the ultrawideband transceiver may be an external discrete device and be located outside the computer, coupled to the computer through an appropriate communication link. The digital power meter 100, computer 180 and additional IEDs (not shown), also equipped with ultrawideband transceivers, of the exemplary power monitoring system 10 may communicate with each other over a wireless network formed by their respective ultrawideband transceivers. The wide bandwidth nature of the ultrawideband transmissions may allow penetration of the electrical panel 190 by at least enough frequencies to make communications between the computer 180 and meter 100, as well as other devices, possible. This may be due to the fact that although the electrical panel 190 is manufactured from metal, there are various voids or RF-transparent portions (eg., cutouts, slots, holes, etc.) in the enclosure that allow certain RF frequencies to penetrate the enclosure based on the size of the voids.

Figure 2:
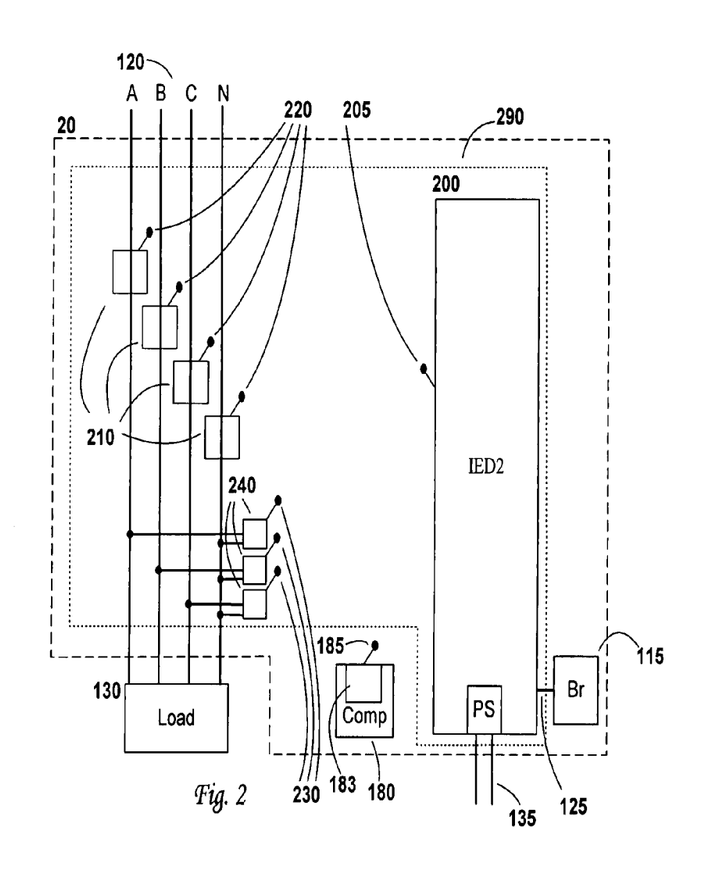
FIG. 2 illustrates a power monitoring system incorporating an IED according to one embodiment.

FIG. 2 shows an exemplary power monitoring system 20 incorporating an IED 200 according to an alternate embodiment. The system 20 may include other IED's (not shown) as well. A three phase WYE power system including power conductors 120 feeds a three phase load 130. Although a three phase WYE system has been diagrammed, other power systems including three phase DELTA and single phase may also be used. The system 20 includes digital wireless current sensors 210, which sense the current flowing in the power conductors 120, and digital wireless voltage sensors 240, which sense the voltage in the power conductors 120. The digital wireless voltage and current sensors 240, 210 each include an ultrawideband antenna 230, 220 which transmit data indicative of the voltage and current in the power conductors. The IED 200 further includes an ultrawide band communications system (not shown) including an ultrawide band antenna 205 which is used to receive the voltage and current data transmitted by the digital wireless voltage and current sensors 240, 210. The digital wireless voltage and current sensors 240, 210 may incorporate any appropriate voltage and current sensing circuitry required. Power supply leads 135 feed power to the IED 200. I/O lines 125 control and monitor a breaker 115 or other external device. In the exemplary system 20, the IED 200 is mounted in a switchgear cabinet 290. Similar to the electrical cabinet 190 of the exemplary system 10 of FIG. 1, the switchgear cabinet 290 is metallic and forms a partial RF shield around the IED 200.

The exemplary system 20 further includes a computer 180 which comprises an ultrawideband communications system (not shown) including an ultrawide band antenna 185. In on embodiment, the ultrawide band communications system of the computer 180 includes an ultrawideband transceiver in the form of an ultrawideband communications card 183. Alternatively, the ultrawideband transceiver may be a discrete external device located outside the computer and coupled to the computer through an appropriate communication link. The IED 200, computer 180, digital wireless voltage and current sensors 240, 210 and any additional IEDs equipped with ultrawideband transceivers may communicate with each other over a network formed by their respective ultrawideband transceivers. The wide bandwidth nature of the ultrawideband transmissions allows penetration of the switchgear cabinet 290 by at least enough frequencies to make communications possible. This may be due to the fact that although the switchgear cabinet is manufactured from metal, there are various voids or RF-transparent portions (eg., cutouts, slots, holes, etc.) in the enclosure that allow certain RF frequencies to penetrate the enclosure based on the size of the voids.

For the purposes of the disclosed embodiments, while the exemplary IED 100, 200 of the exemplary systems 10, 20 described above, was depicted as being located within a metal, i.e. RF-interfering, enclosure, i.e. an electrical panel or switchgear cabinet, the IED 100, 200 need not be enclosed but may merely be located in a relatively RF-inaccessible or RF-hostile, location such as behind a wall or within a structure that includes metal components such as re-bar or near equipment which radiates a substantial amount of interfering RF energy.

In an alternate embodiment, the IED 200 may be omitted from the exemplary system 20 of FIG. 2 as an intermediate device. In this alternate embodiment, the wireless voltage and current sensors 240, 210 communicate directly with the computer 180 which then performs the power parameter calculations as described above. Further, in yet another alternative embodiment, the wireless voltage and current sensors 240, 210 communicate directly with both the IED 200 and the computer 180.

Figure 3:
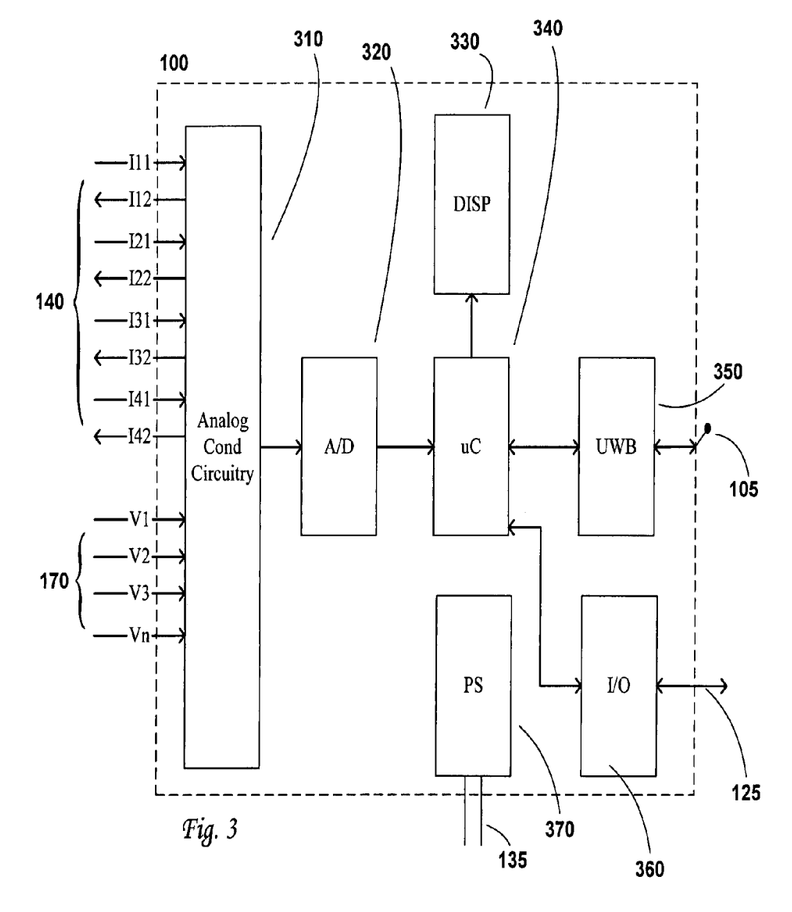
FIG. 3 illustrates a block diagram of the internal circuitry of a digital power meter for use with the system of FIG. 1.

FIG. 3 shows a block diagram of exemplary internal circuitry of the digital power meter 100 described above in conjunction with exemplary power monitoring system 10 of FIG. 1. Analog voltage and current signals enter the analog voltage inputs 170 and analog current inputs 140 respectively. Analog conditioning circuitry 310, coupled with the analog current and voltage inputs 170, 140, converts the relatively high voltage and high current signals on the analog voltage inputs 170 and analog current inputs 140 to lower voltages that are compliant with the input requirements of analog to digital converter (A/D) 320. The A/D 320, which is coupled with the analog conditioning circuitry 310 so as to receive the conditioned lower voltage and current signals, converts these lower voltage and current signals to digital signals representative of the analog voltage and current signals and feeds them to the microcontroller 340. The microcontroller 340 computes various power parameters using these digital signals and stores the computed power parameters in its internal memory (not shown). The microcontroller 340 is further coupled with an ultrawideband transceiver 350 which includes an ultrawideband antenna 105. As described above, the ultrawideband transceiver 350 and antenna 105 facilitate ultrawideband communications between external devices, which also feature ultrawideband communications capabilities, and the microcontroller 340, and thereby the digital power meter 100 generally. Accordingly, the computed power parameters may be accessed by other IEDs and computer 180 via the microcontroller 340 and the ultrawideband transceiver 350 and ultrawideband antenna 105. The microcontroller 340 may also make the power parameters available on the display 330 which is also coupled with the microcontroller 330.

The microcontroller 340 may also monitor/control input/output (I/O) lines 125 through I/O interface circuitry 360. The I/O lines 125 permit the IED 100 to be connected with external devices, such as a circuit breaker 115 (shown in FIG. 1). For instance, microcontroller 340 may trip breaker 115 if a particular power parameter exceeds a preset bounds and/or read the status of breaker 115 via the I/O lines 125 and I/O interface circuitry 360.

The microcontroller 340 may receive configuration and control commands through ultrawideband antenna 105 and ultrawideband transceiver 350 from external soruces. These commands may come from other IEDs or from the computer 180 in the ultrawideband network, for example.

Figure 4:
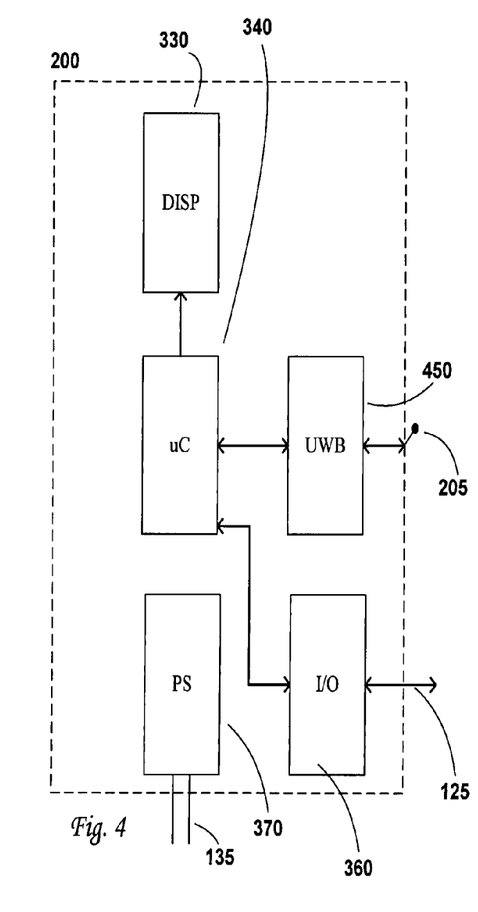
FIG. 4 illustrates a block diagram of the internal circuitry of an IED for use with the system of FIG. 2.

FIG. 4 shows a block diagram of exmplary internal circuitry of IED 200 described above in conjunction with the exemplary power monitoring system 20 of FIG. 2. IED 200 is similar to digital power meter 100 except that the digital signals representative of the analog voltage and current signals in the power conductors 120 are also received by the IED 200 via the ultrawideband antenna 205 and a ultrawideband transceiver 450, as was described above.

It will be appreciated that various combinations of the examples of FIGS. 1-4 are possible. For instance, the IED 200 and any number of the digital wireless sensors 220, 240 may be enclosed in electrical panel 190 and digital power meter 100 and any number of analog current sensors 110 may be enclosed in switchgear cabinet 290. Also, the IED 200 may utilize analog sensing for some of the voltage and/or current signals from power conductors 120 in a similar fashion to digital power meter 100.

Figure 5:
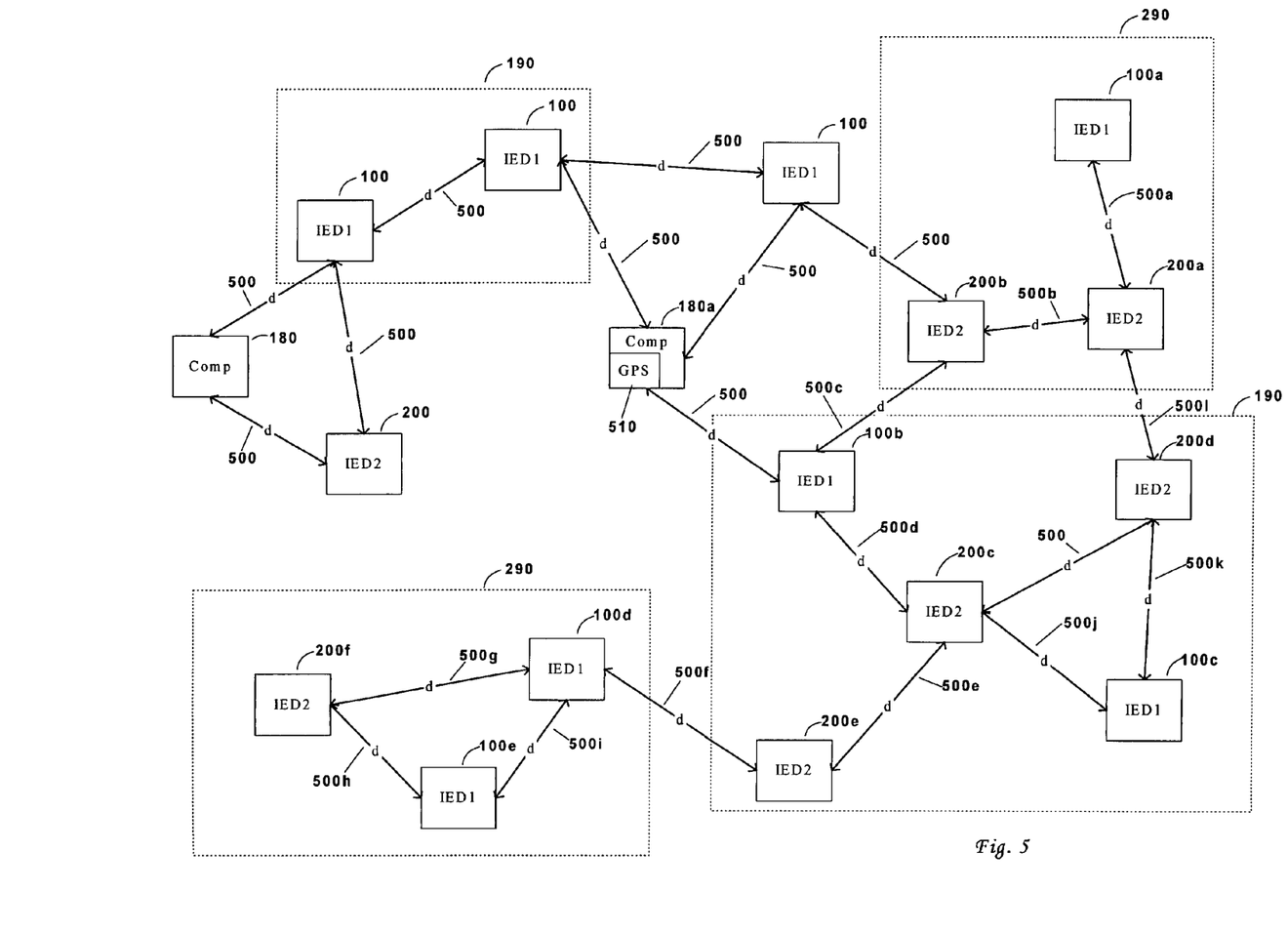
FIG. 5 illustrates a system incorporating the digital power meters, IEDs and computers according to another embodiment.

FIG. 5 depicts an exemplary system incorporating the digital power meters 100, IEDs 200 and computers 180 according to one embodiment. The ultrawideband transceivers 350 of the digital power meters 100 (shown in FIG. 3), ultrawideband transceivers 450 of the IEDs 20 (shown in FIG. 4) and ultrawideband communications cards 183 (shown in FIG. 1) within the various devices form an "ad hoc" network. A link 500 is established between any two devices when communications are possible. Communications will normally be possible when the effective distance 'd' between the two devices is small enough. Enclosures (such as electrical panel 190 or switchgear cabinet 290) may cause the effective distance d to be larger than the actual distance between the devices due to the path that the signal must take. Current FCC rules for RF power output and frequency range result in the distance d being likely smaller than approximately 10 meters for most practical installations. The ultrawideband transceivers 350, ultrawideband transceivers 450 and ultrawideband communications cards 183 operate to allow communications between not just the devices that can directly communicate with each other, but also through various devices, i.e. by acting as repeaters or routers, to allow communications between devices that do not have a direct communications path between them. For instance, digital power meter 100a may communicate with IED 200f over the path that passes through link 500a, IED 200a, link 500b, IED 200b, link 500c, digital power meter 100b, link 500d, IED 200c, link 500e, IED 200e, link 500f, digital power meter 100d, and link 500g. Alternately, the same communications may happen through link 500a, IED 200a, link 5001, IED 200d, link 500k, digital power meter 100c, link 500j, IED 200c, link 500e, IED 200e, link 500f, digital power meter 100d, link 500i, digital power meter 100e and link 500h or any other possible route. The ad-hoc nature of the network results in advantageous redundancy and reliability. The digital power meter 100 may communicate power parameters that it has calculated through these links/routes. The decision as to which route is used is dynamic and changes based on other communications traffic flowing through the "ad hoc" network in addition to the reliability of the various links 500 which may be determined using receive signal strength indications, error rates in a given link 500, etc.

As with any network, the disclosed embodiments permit devices to share resources. For example, many IEDs 200, including digital power meters 100, may include capabilities to establish geographic position based on the Global Positioning System ("GPS"). However, GPS relies on satellite based RF transmissions, which as described above, may be subject to RF-interference depending upon how the power monitoring system is implemented. GPS is especially impractical in providing position information directly to an installation of multiple IEDs 200 and/or digital power meters 100 due to the fact that GPS receiver antennas must "see" at least a portion of the sky. This often results in prohibitive installation costs due to the necessity to route a cable from an antenna outside the facility to each IED 200 or digital power meter 100. The disclosed embodiments may further be used to alleviate this problem. For example, each device may use triangulation techniques to determine the relative position of the devices around it based upon the reception of ultrawideband communications from those devices. Although the metallic enclosures can cause some inaccuracies in this determination, adequate accuracy for most applications is still possible. Where at least one of the devices (for instance computer 180a) includes a GPS receiver 510, the GPS receiver provides absolute geographic location. Using this absolute geographic location and the relative position of the other devices to one another, the absolute geographic location of all the devices can be determined. GPS receiver 510 may only provide a position accuracy of a few meters, so the absolute geographic location of the devices may be similarly accurate, but the relative position accuracy of one device to another may have an accuracy of better than 20 centimeters. Alternatively, the GPS receiver 510 may use differential techniques to provide higher position accuracy.

It will also be appreciated that the ultrawideband communications may utilize security to provide secure communications of data packets before or after transmission of the data. Security mechanisms, such as public/private key encryption and digital signatures may be employed. Secure Sockets Layer ("SSL") creates a secure connection between two communicating applications. For the purposes of the present invention, SSL and Transport Layer Security ("TLS") are equivalent. These protocols are employed by web browsers and web servers in conjunction with HTTP to perform cryptographically secure web transactions. A web resource retrievable with HTTP over TLS is usually represented by the protocol identifier "https" in the URL. TLS can and is used by a variety of Application protocols. Communication using Secure HTTP (S-HTTP) provides independently applicable security services for transaction confidentiality, authenticity, integrity and non-repudiability of origin. S/MIME and Pretty Good Privacy ("PGP") provide encryption and authentication for email and other messages, allowing users to encrypt a message to anyone who has a public key. Furthermore, a message can be signed with a digital signature using a private key. This prevents users from reading messages not addressed to them and from forging messages to appear as though it came from someone else. XML Encryption provides a process for encrypting/decrypting digital content, including XML documents and portions thereof, and an XML syntax is used to represent the encrypted content and information that enables an intended recipient to decrypt it. Web Services Security ("WS-Security") is a proposed IT standard that addresses security when data is exchanged as part of a Web Service. WS-Security specifies enhancements to SOAP messaging aimed at protecting the integrity and confidentiality of a message and authenticating the sender. It also specifies how to associate a security token with a message, without specifying what kind of token is to be used. It is designed to be extensible with future new security mechanisms. A Media Access Control Address ("MAC Address") is a number that is appended to a digital message and provides authentication and integrity for the message.

It is therefore intended that the foregoing detailed description be regarded as illustrative rather than limiting, and that it be understood that it is the following claims, including all equivalents, that are intended to define the spirit and scope of this invention.

We claim:

1. An intelligent electronic device (IED) for monitoring at least one power parameter in a power system, the IED comprising:

at least one voltage input operative to be coupled with at least one power line in said power system and operative to sense at least one voltage in said power system;

at least one current input operative to be coupled with said at least one power line and operative to sense a current flowing through said at least one power line;

at least one analog to digital converter coupled to said voltage input and said current input and operative to produce digital samples indicative of said voltage and current;

a processor coupled with said at least one analog to digital convener and operative to calculate said at least one power parameter;

a power supply operative to supply power to said IED;

a transceiver operative to communicate, at least one data packet comprising said at least one power parameter via time domain pulses of RF energy occupying a wide range of frequencies;

an antenna coupled with said transceiver operative to transmit said RF data packet; and an enclosure which surrounds at least said antenna so as to partially interfere with RF transmissions at a subset of frequencies, said transceiver being operable to transmit said RF data packet out of said enclosure at other frequencies of the wide range of frequencies, said enclosure including a lateral surface comprising at least one void that allows certain RF frequencies to penetrate said enclosure based on the size of said voids.

2. The IED of claim 1 wherein said enclosure is a switchgear cabinet.

3. The IED of claim 1 wherein said enclosure is an electric box.

4. The IED of claim 1 wherein the transceiver is further operative to receive at least one second RF packet comprising at least one of control information and configuration information for said IED.

5. The IED of claim 1 wherein said time domain pulses span at least 500 MHz of RF spectrum.

6. The IED of claim 5 wherein said RF spectrum is above 3 GHz.

7. The IED of claim 6 wherein said transceiver produces less than one milliwatt of RF power during transmission.

8. The IED of claim 7 wherein said transceiver is an ultrawideband transceiver.

9. The IED of claim 1 further comprising I/O circuitry coupled to said processor and operative to control a breaker.

10. The IED of claim 1, wherein said transceiver is operative to form a network with at least one other transceiver via said antenna.

11. The system of claim 10 wherein communications with said network is at a rate of at least 10 Mbps.

12. The system of claim 11 wherein said communications implements at least one security mechanism.

13. The system of claim 10 further comprising at least one computer, each of said at least one computer comprising an additional transceiver operative to integrate into said network.

14. The IED of claim 10 wherein said network facilitates communication between said IED and a second IED via at least two additional IEDs.

15. The IED of claim 1, said IED having a housing surrounding said IED, wherein said antenna is coupled with said housing.

16. The IED of claim 1, said IED having a housing surrounding said IED, wherein at least one portion of said antenna is embedded within said housing.

17. The IED of claim 1 wherein said RF packet contains at least one security mechanism.

18. The IED of claim 1 wherein said power parameter comprises at least one of kW and kWh.

19. The IED of claim 1 wherein said transceiver is operative to communicate with at least three additional transceivers within three additional IEDs and determine the location of said IED relative to at least one of said additional IEDs.

20. The IED of claim 1 wherein said transceiver comprises an ultrawideband transceiver.

21. The IED of claim 1 wherein at least one of said voids comprises a cutout.

22. The IED of claim 1 wherein at least one of said voids comprises a slot.

23. A method of using an intelligent electronic device (IED) for monitoring at least one power parameter in a power system comprising:
   sensing at least one voltage in at least one power line of said power system;
   sensing at least one current in said at least one power line of said power system;
   converting said at least one voltage and current to digital samples representative of said at least one voltage and current;
   calculating at least one power parameter using said digital samples;
   supplying power to said IED;
   producing at least one ultrawideband RF data packet comprising said at least one power parameter;
   coupling an antenna to said IED;
   transmitting said ultrawideband RF data packet from said IED through said antenna; and
   providing an enclosure which surrounds at least said antenna so as to partially interfere with RF transmissions a subset of frequencies, said antenna being coupled to a transceiver operable to transmit said RF data packet out of said enclosure at other frequencies of a wide range of frequencies, said enclosure including a lateral surface comprising at least one void that allows certain RF frequencies to penetrate said enclosure based on the size of said voids.

24. The method of claim 23 further comprising:
   transmitting said ultrawideband RF data packet through at least one enclosure forming a partial RF shield.

25. The method of claim 23 further comprising:
   transmitting at least one second ultrawideband RF data packet to said IED; and
   receiving said at least one second ultrawideband RF data packet within said IED.

26. The method of claim 23 wherein said transmitting further comprises:
   transmitting time domain electromagnetic pulses that span at least 500 MHz of RF spectrum.

27. The method of claim 26 wherein said transmitting further comprises:
   transmitting said time domain electromagnetic pulses occupying an RF spectrum above 3 GHz.

28. The method of claim 23 further comprising:
   controlling at least one breaker based on said calculating.

29. The method of claim 23 further comprising:
   integrating said IED and at least a second and a third IED into a network;
   receiving said ultrawideband RF data packet in said second IED;
   transmitting said ultrawideband RF data packet from said second IED; and
   receiving said ultrawideband RF data packet at said third IED.

30. The method of claim 29 further comprising:
   securing said transmitting and receiving.

31. The method of claim 29 further comprising:
   integrating a computer into said network;
   communicating a sufficient number of additional ultrawideband RF data packets between said IED, said second IED, said third IED and said computer in order to triangulate the location of said IED relative to said computer using known locations of said computer, said second IED and said third IED.

32. The method of claim 23 further comprising:
   securing said transmitting and receiving.

33. The method of claim 23 further comprising:
   embedding said antenna in an enclosure of said IED.

34. The method of claim 23 wherein said calculating comprises calculating kilowatts flowing in said power system.

* * * * *